(12) United States Patent
Kim et al.

(10) Patent No.: US 8,392,741 B2
(45) Date of Patent: Mar. 5, 2013

(54) LATENCY CONTROL CIRCUIT AND SEMICONDUCTOR MEMORY DEVICE INCLUDING THE SAME

(75) Inventors: Kyung-Hoon Kim, Gyeonggi-do (KR); Kyung-Whan Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 519 days.

(21) Appl. No.: 12/751,671

(22) Filed: Mar. 31, 2010

(65) Prior Publication Data
US 2011/0187427 A1 Aug. 4, 2011

(30) Foreign Application Priority Data

Feb. 4, 2010 (KR) .................. 10-2010-0010405

(51) Int. Cl.
*G06F 1/04* (2006.01)
(52) U.S. Cl. .................. 713/401; 713/400; 713/503
(58) Field of Classification Search .................. None
See application file for complete search history.

(56) References Cited

U.S. PATENT DOCUMENTS

2005/0169091 A1* 8/2005 Miki et al. ............ 365/230.03
2010/0142308 A1* 6/2010 Kim ...................... 365/233.13

FOREIGN PATENT DOCUMENTS

| KR | 10-2007-0036635 A | 4/2007 |
| KR | 100791001 | 1/2008 |
| KR | 100903384 B | 5/2009 |
| KR | 1020090067799 | 6/2009 |

OTHER PUBLICATIONS

Notice of Allowance issued by the Korean Intellectual Property Office on May 30, 2011.
Kyung-Hoo Kim et al., "An 1.35V 2133Mbps DDR3 SDRAM with EDSC DLL and N-counting latency controller," Design Team, Hynix Semiconductor Inc. Ichon, Korea, ISSCC 2010 (2010).

* cited by examiner

*Primary Examiner* — Dennis M Butler
(74) *Attorney, Agent, or Firm* — IP & T Group LLP (57) ABSTRACT

A latency control circuit includes a delay unit configured to delay an input signal for a delay corresponding to a phase difference between an external clock and an internal clock and generate a delayed input signal, a delay information generation unit configured to generate a delay information based on a latency information and a delay amount of the input signal caused by a chip including the latency control circuit, a shift unit configured to shift the delayed input signal for a time period corresponding to the delay information in synchronism with the internal clock and an asynchronous control unit configured to selectively control the shift unit to output the delayed input signal without performing a shift operation.

19 Claims, 8 Drawing Sheets

LATENCY CONTROL CIRCUIT AND SEMICONDUCTOR MEMORY DEVICE INCLUDING THE SAME

CROSS-REFERENCE TO RELATED APPLICATION

The present application claims priority of Korean Patent Application No. 10-2010-0010405, filed on Feb. 4, 2010, which is incorporated herein by reference in its entirety.

BACKGROUND OF THE INVENTION

Exemplary embodiments of the present invention relate to a method for fabricating a latency control circuit, and more particularly, to a latency control circuit efficiently performing a latency control operation.

When operations are performed between plural semiconductor devices, a predetermined latency occurs from receiving an operational request signal to starting an operation corresponding to the operational request signal. For example, a memory controller outputs a termination command signal and a memory device starts terminating a data pad after a column address strobe (CAS) latency from an input timing of the termination command signal. In order to ensure the reliable processing of the operations between the semiconductor devices, it is important to properly control the latency. A latency control circuit is used for controlling the latency.

A conventional method for controlling a latency of a termination command signal is disclosed in Korean Patent Application No. 10-2006-0049027, herein incorporated by reference. The conventional method uses two clocks, i.e., an internal clock and an external clock having different domains from each other, and two counters respectively allocated to the clocks. For performing reliable operations, the conventional method should continuously provide the clocks even for an asynchronous mode and, therefore, the power consumption increases.

SUMMARY OF THE INVENTION

An embodiment of the present invention is directed to a latency control circuit capable to perform an accurate control operation and a semiconductor device including the same.

In accordance with an embodiment of the present invention, a latency control circuit includes a delay unit configured to delay an input signal for a delay corresponding to a phase difference between an external clock and an internal clock and generate a delayed input signal, a delay information generation unit configured to generate a delay information based on a latency information and a delay amount of the input signal caused by a chip including the latency control circuit, a shift unit configured to shift the delayed input signal for a time period corresponding to the delay information in synchronism with the internal clock and an asynchronous control unit configured to selectively control the shift unit to output the delayed input signal without performing a shift operation.

In accordance with another embodiment of the present invention, a semiconductor device includes a first delay unit configured to delay a termination command for a phase difference between an external clock and an internal clock and generate a delayed termination command, a delay information generation unit configured to generate a delay information based on a latency information and a delay amount of the termination command caused by the semiconductor device, a first shift unit configured to shift the delayed termination command for a time period corresponding to the delay information in synchronism with the internal clock and generate an internal termination command, a second delay unit configured to delay a write command inputted during an active period of the termination command for a delay corresponding to the phase difference and generate a delayed write command, a second shift unit configured to shift the delayed write command for a time period corresponding to the delay information in synchronism with the internal clock and generate a dynamic termination command and a termination unit configured to terminate a data pad in response to the internal termination command and the dynamic termination command.

In accordance with yet another embodiment of the present invention, a semiconductor device includes an input unit configured to receive a first signal and a second signal and generate an enable signal indicating an activation of the first and second signals, a delay unit configured to delay the enable signal for a delay corresponding to a phase difference between an external clock and an internal clock and generate a delayed enable signal, a path selection unit configured to transmit the delayed enable signal; a first delay information generation unit configured to generate a first delay information based on a latency information of the first signal and a delay amount of the first signal caused by the semiconductor device, a second delay information generation unit configured to generate a second delay information based on a latency information of the second signal and a to delay amount of the second signal caused by the semiconductor device, a first shift unit configured to shift the delayed enable signal transmitted from the path selection unit in synchronism with the internal clock based on the first delay information and a second shift unit configured to shift the delayed enable signal transmitted from the path selection unit in synchronism with the internal clock based on the second delay information.

DESCRIPTION OF EXEMPLARY EMBODIMENTS

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully enable those having ordinary skill in the art to practice the invention without undue experimentation. Throughout the disclosure, like reference numerals refer to like parts throughout the various figures and embodiments of the present invention.

Figure 1:
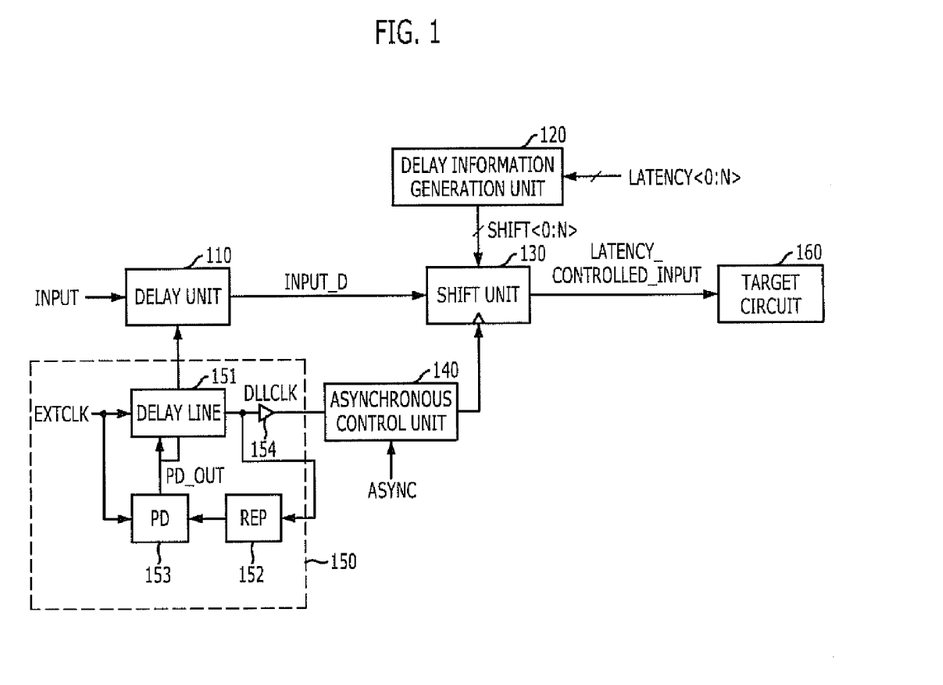
FIG. 1 is a block diagram illustrating a latency control circuit for use in a semiconductor device in accordance with an embodiment of the present invention.

FIG. 1 is a block diagram illustrating a latency control circuit for use in a semiconductor device in accordance with an embodiment of the present invention.

The latency control circuit includes a delay unit 110, a delay information generation unit 120, a shift unit 130, an asynchronous control unit 140, and a delay locked loop (DLL) 150.

The delay unit 110 delays an input signal INPUT according to a difference between an external clock EXTCLK and the internal clock DLLCLK and outputs the delayed input signal INPUT_D. The input signal INPUT and the delayed input signal INPUT_D are respectively synchronized with the external clock EXTCLK and the internal clock DLLCLK. A delay amount of the delay unit 110 is determined by the DLL 150.

The DLL 150 delays the external clock EXTCLK and generates the internal clock DLLCLK. The DLL 150 includes a delay line 151, a replica delay line 152 (REP), a phase detector 153 (PD), and a clock driver 154. A delay amount of the delay line 151 is determined by a phase detection result PD_OUT of the phase detector 153. By implementing the delay line 151 and the delay unit 110 with the same structure and controlling them with the same signal, i.e., the phase detection result PD_OUT, the delay line 151 and the delay unit 110 have the same delay amount. Hereinafter, the delay amount of the delay line 151 or the delay unit 110 is denoted with a reference signal tDL. Because detailed structures and operations of the DLL are well known to those skilled in the art, the explanation thereof will be omitted.

The delay information generation unit 120 generates a delay information signal SHIFT<0:N> in response to a latency information signal LATENCY<0:N>. The delay information signal SHIFT<0:N> has an information about the delay amount of the input signal INPUT.

The shift unit 130 shifts the delayed input signal INPUT_D for a time period corresponding to the delay information signal SHIFT<0:N> in synchronism with the internal clock DLLCLK and outputs a latency controlled input signal LATENCY_CONTROLLED_INPUT. The output of the latency control circuit/shift unit 130, i.e., the latency controlled input signal LATENCY_CONTROLLED_INPUT, is inputted to a target circuit 160. The target circuit 160 is controlled by the input signal INPUT. A predetermined delay occurs during the transfer of the latency controlled input signal LATENCY_CONTROLLED_INPUT to the target circuit 160. The delay amount of the latency controlled input signal LATENCY_CONTROLLED_INPUT is modeled by the replica delay line 152 (REP) of the DLL 150. Hereinafter, the delay amount of the latency controlled input signal LATENCY_CONTROLLED_INPUT or the replica delay line 152 is denoted with a reference signal tREP.

The value of the delay information signal SHIFT<0:N> is obtained by subtracting the delay amount tREP of the latency controlled input signal LATENCY_CONTROLLED_INPUT from the delay corresponding to the latency information signal LATENCY<0:N>. Accordingly, the input signal INPUT may arrive at the target circuit 160 after the latency value corresponding to the latency information signal LATENCY<0:N>.

The asynchronous control unit 140 controls the shift unit 130 to output the delayed input signal INPUT_D without performing the shift operation. By the operation of the asynchronous control unit 140, the semiconductor device (for example, a chip) is possible to easily convert the synchronous/asynchronous modes.

Figure 2:
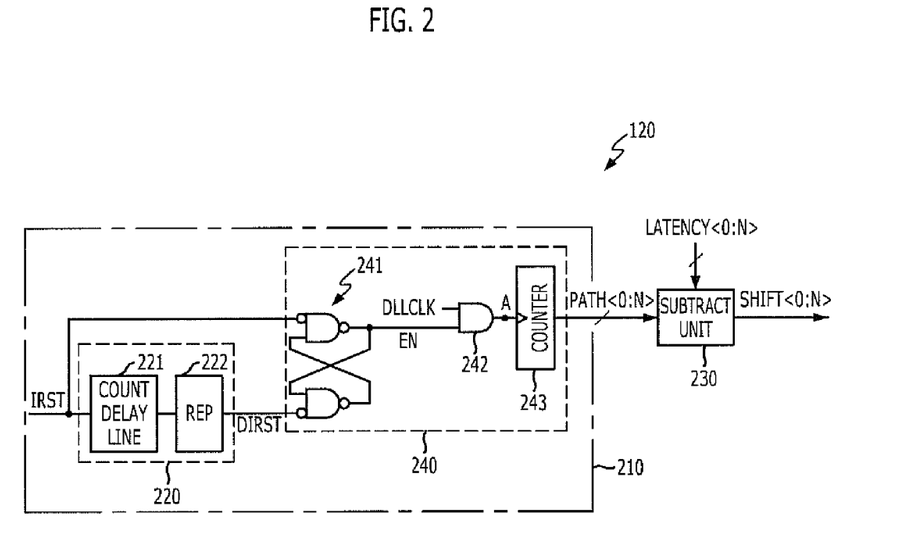
FIG. 2 is a schematic circuit diagram of a delay information generation unit shown in FIG. 1.

FIG. 2 is a schematic circuit diagram of the delay information generation unit 120 shown in FIG. 1.

The delay information generation unit 120 includes a delay count unit 210 and a subtract unit 230. The delay count unit 210 outputs a count corresponding to the delay amount of the input signal INPUT caused inside the semiconductor device. The subtract unit 230 subtracts the count output of the delay count unit 210 from the latency information signal LATENCY<0:N>.

The delay count unit 210 includes a count delay unit 220 and a count unit 240. The count delay unit 220 delays a count signal IRST for the value corresponding the delay amounts of the delay line 151 and the replica delay line 152. The count unit 240 outputs a count value PATH<0:N> by counting an activation number of the internal clock DLLCLK during a period starting from an activation of the count signal IRST and ending at an activation of a delayed count signal DIRST outputted from the count delay unit 220.

The count delay unit 220 includes a count delay line 221 for delaying the count signal IRST and a count replica delay line 222. The count delay line 221 and the count replica delay line 222 respectively have the same delay amounts with the delay line 151 and replica delay line 152. The delay amount of the input signal INPUT caused inside the semiconductor device corresponds to the delay amounts of the delay line 151 and the replica delay line 152.

Signals activated after the DLL 150 completes a locking operation may be used as the count signal IRST because the delay amount of the count delay unit 221 is determined after the DLL 150 completes the locking operation.

The count unit 240 includes a latch 241, a NAND gate 242, and a counter 243. When the count signal IRST is activated, the latch 241 outputs an enable signal EN of a logic high level. The counter 243 receives the internal clock DLLCLK in response to the enable signal EN of the logic high level. When the delayed count signal DIRST is activated, the latch 241 outputs the enable signal EN of a logic low level. The counter 243 stops a counting operation. That is, the counter 243 outputs the count value PATH<0:N> by counting the activation number of the internal clock DLLCLK during the period starting from an activation of the count signal IRST and ending at an activation of the delayed count signal DIRST. Accordingly, the count value PATH<0:N> corresponds to the delay amount of the input signal INPUT caused inside the semiconductor device.

The subtract unit 230 subtracts the count value PATH<0:N> from the latency information signal LATENCY<0:N> and outputs the delay information signal SHIFT<0:N>.

Figure 3:
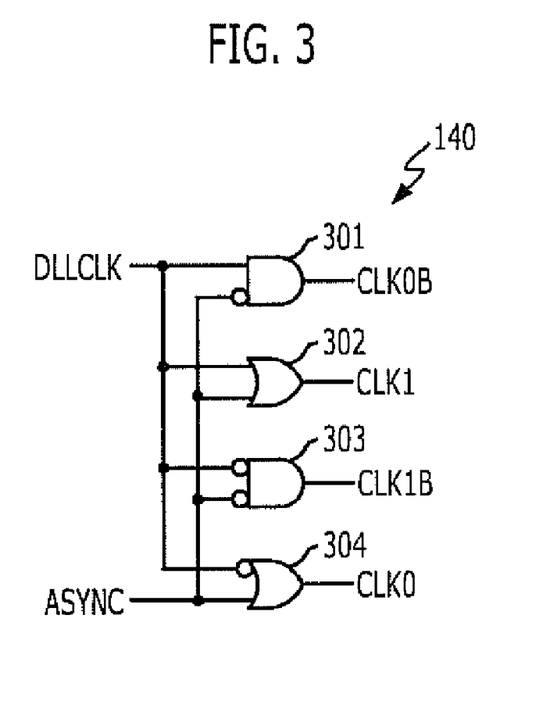
FIG. 3 is a schematic circuit diagram of an asynchronous control unit shown in FIG. 1.

FIG. 3 is a schematic circuit diagram of the asynchronous control unit 140 shown in FIG. 1.

The asynchronous control unit 140 includes a plurality of logic gates 301 to 304 receiving the internal clock DLLCLK and an asynchronous signal ASYNC. The asynchronous signal ASYNC has a logic high level during the asynchronous mode and has a logic low level during a synchronous mode. The synchronous/asynchronous modes of the semiconductor device may be determined by a clock enable signal CKE, an idle signal IDLE, and a mode register set (MRS). The asynchronous control unit 140 transmits the internal clock DLLCLK to the shift unit 130 during the synchronous mode. During the asynchronous mode, the asynchronous control unit 140 fixes the logic level of the internal clock DLLCLK and transmits the fixed logic level to the shift unit 130.

Table 1 shows the operation of the asynchronous control unit 140. 'DLLCLK' indicates that the corresponding clock has the logic level corresponding to the internal clock DLLCLK. 'DLLCLKB' indicates that the corresponding clock has the inverted logic level of the internal dock DLLCLK.

TABLE 1

|  | ASYNC = 'L',<br>(synchronous mode) | ASYNC = 'H',<br>(asynchronous mode) |
| --- | --- | --- |
| CLK0B | DLLCLK | 'L' |
| CLK0 | DLLCLKB | 'H' |
| CLK1 | DLLCLK | 'H' |
| CLK1B | DLLCLKB | 'L' |

Figure 4:
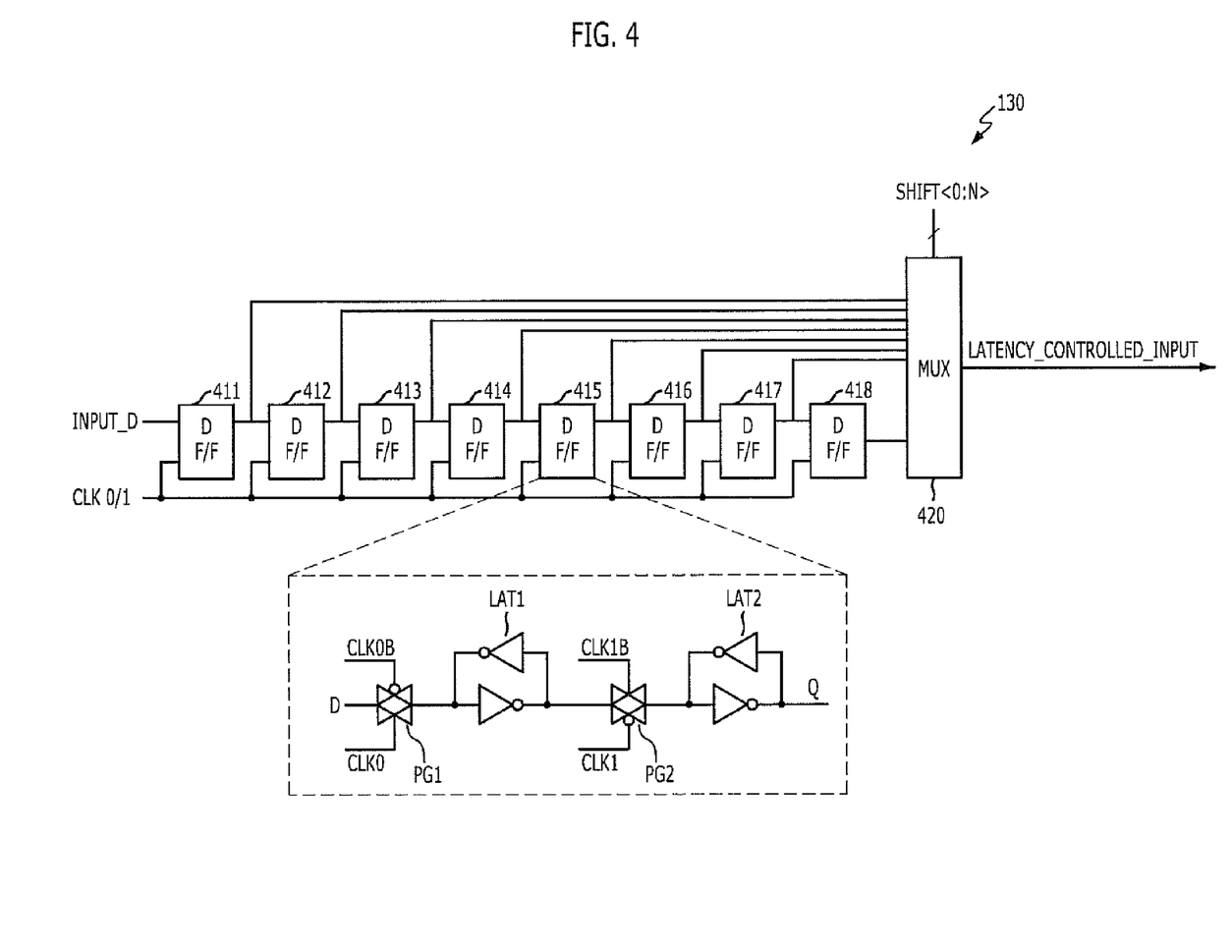
FIG. 4 is a schematic circuit diagram illustrating a shift unit shown in FIG. 1

FIG. 4 is a schematic circuit diagram illustrating the shift unit 130 shown in FIG. 1.

The shift unit 130 includes a plurality of D-type flip-flops 411 to 418 and a multiplexer 420. The D-type flip-flops 411 to 418 shift their input signals for one clock by using outputs CLK0, CLK0B, CLK1, CLK1B of the asynchronous control unit 140. The multiplexer 420 selects one of outputs of the D-type flip-flops 411 to 418 and outputs the selected one as the latency controlled input signal LATENCY_CONTROLLED_INPUT. The output of the D-type flip-flops 411 to 418 selected by the multiplexer 420 is determined by the delay information signal SHIFT<0:N>. For example, when the delay information signal SHIFT<0:N> has '1', the output of the first D—type flip-flop 411 is outputted as the latency controlled input signal LATENCY_CONTROLLED_INPUT; and when the delay information signal SHIFT<0:N> has '4', the output of the fourth D-type flip-flop 414 is outputted as the latency controlled input signal LATENCY_CONTROLLED_INPUT.

Each of the D-type flip-flops 411 to 418 includes two pass gates PG1 and PG2 and two latches LAT1 and LAT2. The first pass gate PG1 is turned on/off in response to the outputs CLK0 and CLK0B of the asynchronous control unit 140. The second pass gate PG2 is turned on/off in response to the outputs CLK1 and CLK1B of the asynchronous control unit 140. During the synchronous mode, the D-type flip-flops 411 to 418 shift their input signals during each clock cycle. During the asynchronous mode, the pass gates PG1 and PG2 output their inputs without performing a shift operation in response to the outputs CLK0, CLK0B, CLK1, CLK1B of the asynchronous control unit 140 having the logic levels shown in [Table 1].

Figure 5:
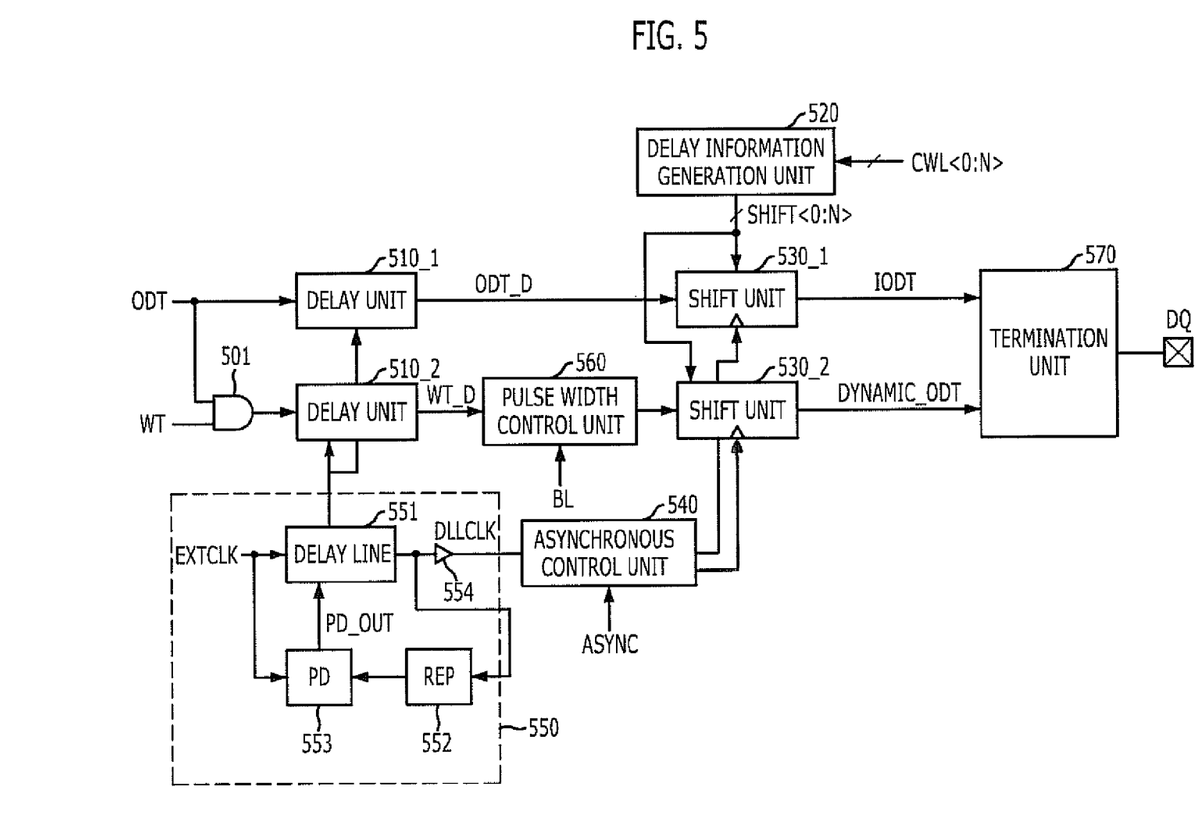
FIG. 5 is a block diagram illustrating an embodiment of the present invention in which the latency control circuit is used for a termination operation of the semiconductor device.

FIG. 5 is a block diagram illustrating an embodiment of the present invention that the latency control circuit is used for a termination operation of the semiconductor device.

The semiconductor memory device includes two delay units 510_1 and 510_2, a delay information generation unit 520, two shift units 530_1 and 530_2, a termination unit 570, a DLL 550, a pulse width control unit 560, and an asynchronous control unit 540.

The first delay unit 510_1 delays a termination command signal ODT for a delay amount corresponding a phase difference between an external clock EXTCLK and an internal clock DLLCLK. The termination command signal ODT is outputted from a memory controller to the semiconductor device. When the termination command signal ODT is inputted, the semiconductor device terminates a data pad DQ after a CAS latency from the input of the termination command signal ODT. The first delay unit 510_1 has the delay amount equal to that of a delay line 551 of the DLL 550. Hereinafter, the delay amount of the first delay unit 510_1 and the delay line 551 are denoted by the reference signal 'tDL'.

The delay information generation unit 520 generates a delay information SHIFT<0:N> based on a latency information. Herein, a CAS write latency information CWL<0:N> becomes the latency information. The delay information generation unit 520 generates the delay information SHIFT<0:N> by subtracting the delay amount of the termination command signal ODT caused by the semiconductor device from the CAS write latency information CWL<0:N>. The delay information generation unit 520 may have the same structure with the delay information generation unit 120 shown in FIGS. 1 and 2.

The first shift unit 530_1 shifts a delayed termination command signal ODT_D outputted from the first delay unit 510_1 for a time period corresponding to the delay information SHIFT<0:N> in synchronism with the internal clock DLLCLK and outputs an internal termination command signal IODT. The first shift unit 530_1 may have the same structure with the shift unit 130 shown in FIGS. 1 and 4.

According to the operations of the first delay unit 510_1, the delay information generation unit 520, and the first shift unit 530_1, the termination command signal ODT arrives at the termination unit 570 after a CAS write latency CWL<0:N>.

The second delay unit 510_2 delays a write command signal WT inputted during an active period of the termination command signal ODT for a delay amount equal to that of the first delay unit 510_1. When the write command signal WT is inputted during the active period of the termination command signal ODT, the semiconductor device performs a dynamic termination operation. The dynamic termination operation changes a termination resistance in response to the write command signal WT inputted during the termination operation. An AND gate 501 is coupled to an input terminal of the second delay unit 510_2. The AND gate 501 controls the write command signal WT to be transmitted to the second delay unit 510_2 only during the active period of the termination command signal ODT. The second delay unit 510_2 has the delay amount equal to that of the first delay unit 510_1 or the delay line 551 of the DLL 550.

The second shift unit 530_2 shifts an output WT_D of the second delay unit 510_2 for a time period corresponding to the delay information SHIFT<0:N> in synchronism with the internal clock DLLCLK and outputs a dynamic termination command signal DYNAMIC_ODT. The second shift unit 530_2 may have the same structure with the shift unit 130 shown in FIGS. 1 and 4.

The pulse width control unit 560 is coupled between the second delay unit 510_2 and the second shift unit 530_2 and controls a pulse width of the dynamic termination command signal DYNAMIC_ODT based on a burst length signal BL. For example, the pulse width control unit 560 controls the pulse width of the dynamic termination command signal DYNAMIC_ODT to be four clock cycles in response to a burst length of four and to be six clock cycles in response to the burst length of 6.

Although the pulse width control unit 560 in FIG. 5 is shown to be coupled to an output terminal of the second delay unit 510_2, the pulse width control unit 560 may also be coupled to another place, e.g., an input terminal of the AND gate 501, an input terminal of the second delay unit 510_2, or an output terminal of the second shift unit 530_2.

The asynchronous control unit 540 controls the shift units 530_1 and 530_2 not to perform the shift operation during the asynchronous mode. The asynchronous control unit 540 may have the same structure with the asynchronous control unit 140 shown in FIGS. 1 and 3.

The termination unit 570 terminates the data pad DQ in response to the internal termination command signal IODT and the dynamic termination command signal DYNAMIC_ODT. The termination unit 570 terminates the data pad DQ to a predetermined resistance during an active period of the internal termination command signal IODT. During an active period of the dynamic termination command signal DYNAMIC_ODT, the termination unit 570 adjusts the resistance of the data pad DQ according to the dynamic termination operation.

According to the operations of the second delay unit 510_2, the delay information generation unit 520, and the second shift unit 530_2, the write command signal WT arrives at the termination unit 570 after a CAS write latency CWL<0:N>. Herein, the pulse width control unit 560 expands the pulse width of the write command signal WT in response to the burst length signal BL.

Figure 6:
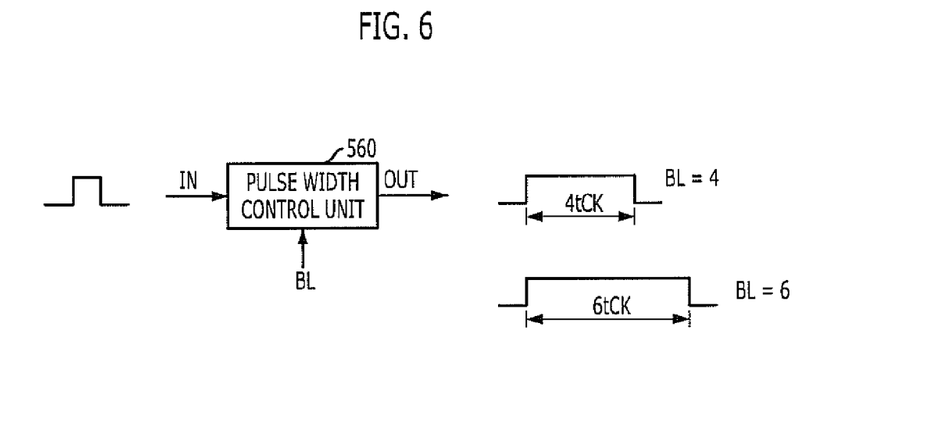
FIG. 6 is a diagram illustrating an operation of a pulse width control unit shown in FIG. 5.

FIG. 6 is a diagram illustrating an operation of the pulse width control unit 560 shown in FIG. 5.

The pulse width control unit 560 controls the pulse width of an input signal IN whose pulse width is one clock cycle to be four clock cycles in response to BL corresponding to a burst length of four and to be six clock cycles in response to the burst length of 6.

Figure 7:
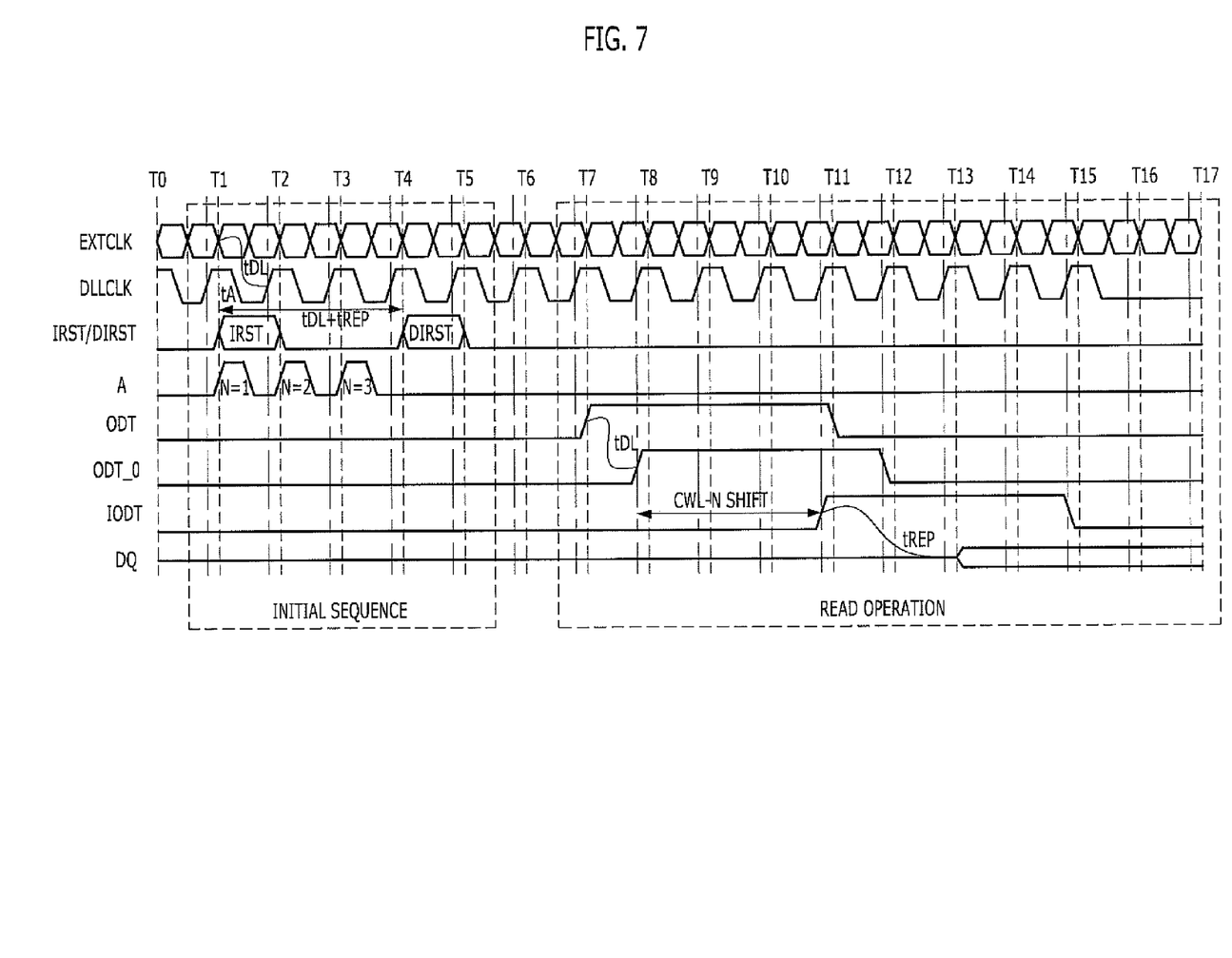
FIG. 7 is a timing diagram illustrating a termination operation of the semiconductor device shown in FIG. 5.

FIG. 7 is a timing diagram illustrating a termination operation of the semiconductor device shown in FIG. 5.

The DLL 550 generates the internal clock DLLCLK by delaying the external clock EXTCLK for the delay amount tDL. After the count signal IRST is activated, the delayed count signal DIRST is activated after a delay caused by the count delay line and the count replica delay line included in the delay information generation unit 520. In FIG. 7, the phase difference between the count signal IRST and the delayed count signal DIRST is three clock cycles and, thus, the count value PATH<0:N> becomes three. When the termination command signal ODT is inputted, the first delay unit 510_1 delays the termination command signal ODT for the delay amount tDL and generates the delayed termination command signal ODT_D. The subtract unit included in the delay information generation unit 520 generates a delay information signal SHIFT<0:N> by subtracting three from the CAS write latency information CWL<0:N>. Thus, the delay information signal SHIFT<0:N> becomes 'CWL<0: N>−3'. The first shift unit 530_1 delays the delayed termination command signal ODT_D for the value corresponding to the delay information SHIFT<0:N>, CWL<0:N>−3, in synchronism with the internal clock DLLCLK and outputs the internal termination command signal IODT. The internal termination command signal IODT is delayed for the delay amount tREP while being transmitted to the termination unit 570.

Through the operations mentioned above, the termination command signal ODT arrives at the termination unit 570 after a CAS write latency CWL<0:N> from the input of the termination command signal ODT.

Figure 8:
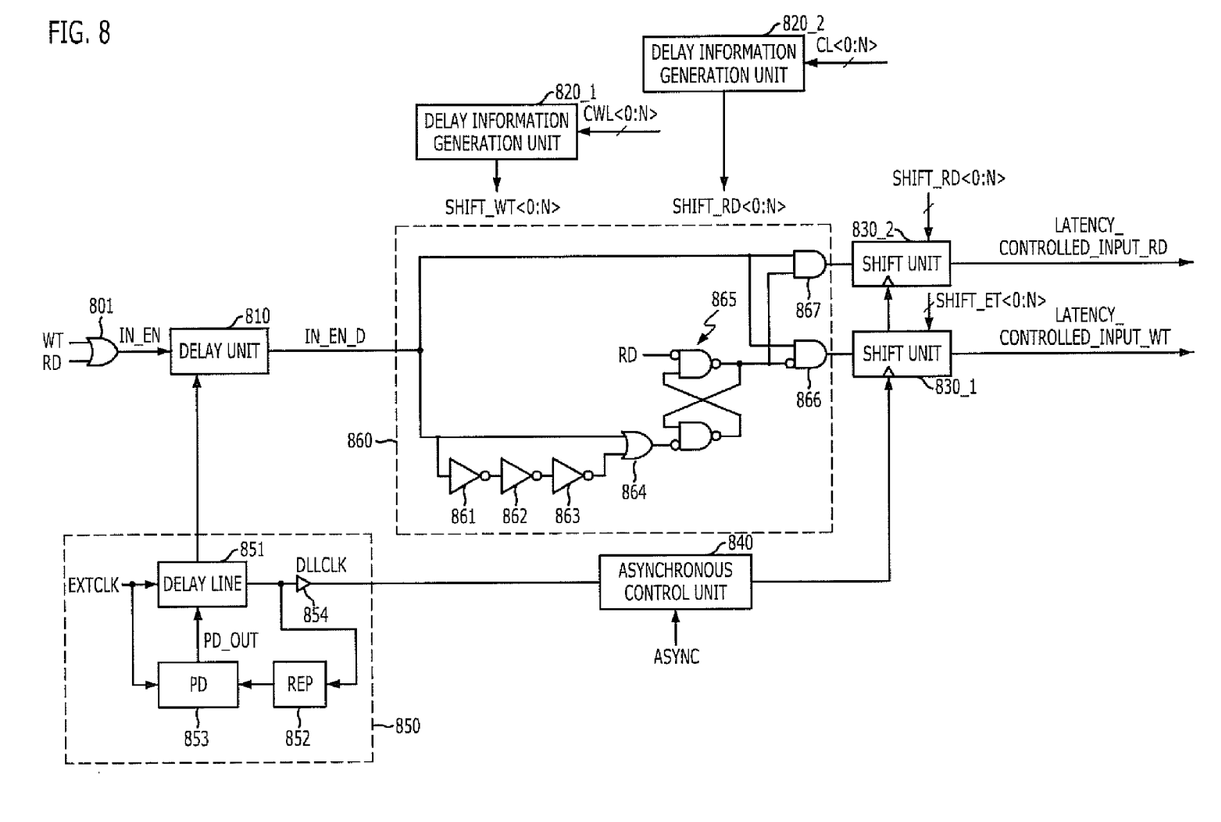
FIG. 8 is a block diagram illustrating another embodiment of the present invention in which the latency control circuit is used for read and write operations of the semiconductor device.

FIG. 8 is a block diagram illustrating another embodiment of the present invention in which the latency control circuit is used for read and write operations of the semiconductor device.

The semiconductor memory device includes an input unit 801, a delay unit 810, a path selection unit 860, two delay information generation units 820_1 and 820_2, two shift units 830_1 and 830_2, a DLL 550 and an asynchronous control unit 840.

The input unit 801 receives the write command signal WT and a read command signal RD and generates an input signal IN_EN indicating an activation of the write command signal WT and the read command signal RD. The input unit 801 may be implemented with an OR gate as shown in FIG. 8.

The delay unit 810 delays the input signal IN_EN by a delay amount corresponding to a phase difference between an external clock EXTCLK and an internal clock DLLCLK. The delay unit 810 has the same structure with a delay line 851 included in the DLL 850.

The first delay information generation unit 820_1 generates a first delay information SHIFT_WT<0:N> based on the CAS write latency information CWL<0:N> and the delay amount of the write command signal WT caused by the semiconductor device. The first delay information generation unit 820_1 generates the first delay information SHIFT_WT<0: N> by subtracting the delay amount of the write command signal WT from the CAS write latency information CWL<0: N>. The first delay information generation unit 820_1 may have the same structure with the delay information generation unit 120 shown in FIGS. 1 and 2.

The second delay information generation unit 820_2 generates a second delay information SHIFT_RD<0:N> based on a CAS latency information CL<0:N> and a delay amount of the read command signal RD caused by the semiconductor device. The second delay information generation unit 820_2 generates the second delay information SHIFT_RD<0:N> by subtracting the delay amount of the read command signal RD from the CAS latency information CL<0:N>. The second delay information generation unit 820_2 may have the same structure with the delay information generation unit 120 shown in FIGS. 1 and 2.

The path selection unit 860 transmits the input signal IN_EN to one of the first and second shift units 830_1 and 830_2. The path selection unit 860 transmits the input signal IN_EN to the first shift unit 830_1 for the write operation and to the second shift unit 830_2 for the read operation. The path selection unit 860 includes a latch 865, two AND gates 866 and 867, an OR gate 864, and a plurality of inverters 861 to 863. The latch 865 outputs a signal having a logic high level in response to the read command signal RD activated as a logic high level. Accordingly, the latch 865 transmits a delayed input signal IN_EN_D outputted from the delay unit 810 to the second shift unit 830_2 in response to the read command signal RD of the logic high level. After a predetermined time, the latch 865 outputs a signal having a logic low level and, therefore, the delayed input signal IN_EN_D is transmitted to the first shift unit 830_1. That is, the patch selection unit transmits the delayed input signal IN_EN_D to the second shift unit 830_2 for the predetermined time and transmits the delayed input signal IN_EN_D to the first shift unit 830_1.

The first shift unit 830_1 shifts an output of the path selection unit 860 during a time period corresponding to the first delay information SHIFT_WT<0:N> outputted from the first delay information generation unit 820_1. The second shift unit 830_2 shifts the output of the path selection unit 860 during a time period corresponding to the second delay information SHIFT_RD<0:N> outputted from the second delay information generation unit 820_2. The first and second shift units 830_1 and 830_2 may have the same structure with the shift unit 130 shown in FIGS. 1 and 4.

The asynchronous control unit 840 selectively controls the logic level of the internal clock DLLCLK so that the first and second shift units 830_1 and 830_2 output their input signals without performing the shift operation. The asynchronous control unit 840 may have the same structure with the asynchronous control unit 140 shown in FIGS. 1 and 3.

The semiconductor memory device shown in FIG. 8 shares the delay unit 810 and the path selection unit 860 for the read and write command signals RD and WT. Thus, the size of the semiconductor device may be reduced. The output LATENCY_CONTROLLED_WT of the first shift unit 830_1 is used for the dynamic termination command as well as the other operations relative to the write operation. The output LATENCY CONTROLLED_RD of the second shift unit 830_2 is used for the read command whose latency is controlled.

In the embodiment shown in FIG. 8, it is possible to use to control the latency of two different signals used in the semiconductor device instead of the read and write command signals RD and WT. In this case, the two difference signals are inputted to the input unit 801. Hereinafter, the two different signals referred to first and second signals. The first and second delay information generation units 820_1 and 820_2 generate the first and second delay information based on the first and second signals, respectively. The patch selection unit 860 transmits the output of the delay unit 810 to the first shift unit 830_1 during an operation period of the first signal and to the second shift unit 830_2 during an operation period of the second signal. As mentioned above, the embodiment of the present invention as shown in FIG. 8 may also be used for other signals used in the semiconductor device as well as the read and write command.

As mentioned above, according to one embodiment of the present invention, it is possible to accurately control the latency by delaying an input signal for a delay corresponding to the phase difference between the external clock and the internal clock and the value generated by subtracting the delay amount of the input signal caused by the semiconductor device from the latency of the input signal. According to an embodiment of the invention, a switch between the synchronous mode to the asynchronous mode may be conveniently made. Finally, according to an embodiment of the present invention, the latency of the two different signals may be made by using a single control circuit.

While the present invention has been described with respect to the exemplary embodiments, it will be apparent to those skilled in the art that various changes and modifications may be made without departing from the spirit and scope of the invention as defined in the following claims and their equivalents.

What is claimed is:

1. A latency control circuit, comprising:
a delay unit configured to delay an input signal for a delay corresponding to a phase difference between an external clock and an internal clock and generate a delayed input signal;
a delay information generation unit configured to generate a delay information based on a latency information and a delay amount of the input signal caused by a chip including the latency control circuit;
a shift unit configured to shift the delayed input signal for a time period corresponding to the delay information in synchronism with the internal clock; and
an asynchronous control unit configured to selectively control the shift unit to output the delayed input signal without performing a shift operation.

2. The latency control circuit of claim 1, wherein the delay information generation unit generates the delay information by subtracting the delay amount of the input signal caused by the chip from the latency information of the input signal.

3. The latency control circuit of claim 1, wherein the delay information generation unit includes:
a delay count unit configured to count the delay amount of the input signal caused by the chip; and
a subtract unit configured to subtract the delay amount of the input signal caused by the chip from the latency information of the input signal.

4. The latency control circuit of claim 3, wherein the delay count unit includes:
a count delay line configured to delay a count signal for a delay amount of a count delay line and a delay amount of a replica delay line and generate a delayed count signal; and
a count unit configured to count an activation number of the internal clock during a period which starts from an activation of the count signal and ends at an activation of the delayed count signal and generate a count value.

5. The latency control circuit of claim 1, wherein the shift unit includes a plurality of D-type flip-flops, each of which includes at least one pass gate controlled by the internal clock to be turned on during an asynchronous mode.

6. The latency control circuit of claim 1, wherein the delay unit has a delay amount equal to that of a delayed locked loop (DLL) generating the internal clock.

7. A semiconductor device, comprising:
a first delay unit configured to delay a termination command for a delay corresponding to a phase difference between an external clock and an internal clock and generate a delayed termination command;
a delay information generation unit configured to generate a delay information based on a latency information and a delay amount of the termination command caused by the semiconductor device;
a first shift unit configured to shift the delayed termination command for a time period corresponding to the delay information in synchronism with the internal clock and generate an internal termination command;
a second delay unit configured to delay a write command inputted during an active period of the termination command for a delay corresponding to the phase difference and generate a delayed write command;
a second shift unit configured to shift the delayed write command for time period corresponding to the delay information in synchronism with the internal clock and generate a dynamic termination command; and
a termination unit configured to terminate a data pad in response to the internal termination command and the dynamic termination command.

8. The semiconductor device of claim 7 further comprising a pulse width control unit located on a path for generating the dynamic termination command based on the write command and configured to adjust a pulse width of the dynamic termination command based on a burst length.

9. The semiconductor device of claim 7 further comprising an asynchronous control unit configured to selectively control the internal clock so that the first and second shift units output their respective input signals without performing a shift operation.

10. The semiconductor device of claim 7 further comprising a delay locked loop, wherein the delayed locked loop comprises:
a third delay unit configured to delay the external clock and generate the internal clock;
a replica delay unit configured to delay the internal clock and generate a feedback clock; and a phase comparison unit configured to compare phases of the feedback clock and the external clock and determine a delay amount of the third delay unit based on a comparison result, wherein the delay amount of the termination command caused by the semiconductor device corresponds to a delay obtained by adding the delay amount of the third delay unit and a delay amount of the replica delay unit.

11. The semiconductor device of claim 10, wherein the first and second delay units delay their respective input signals for the delay amount of the third delay unit.

12. The semiconductor device of claim 11, wherein the latency information is a column address strobe write latency information.

13. The semiconductor device of claim 12, wherein the delay information generation unit generates the delay information by subtracting the delay amount of the replica delay unit from the column address strobe write latency information.

14. The semiconductor device of claim 12, wherein the delay information generation unit comprises:

a delay count unit configured to output a count corresponding to the delay amount of the termination command caused by the semiconductor device; and a subtract unit configured to subtract the delay amount of the replica delay unit from the column address strobe write latency information.

15. The semiconductor device of claim 7, wherein each of the first and second shift units, respectively, includes at least one pass gate controlled by the internal clock to be turned on during an asynchronous mode.

16. A semiconductor device, comprising:

an input unit configured to receive a first signal and a second signal and generate an enable signal indicating an activation of the first and second signals;

a delay unit configured to delay the enable signal for a delay corresponding to a phase difference between an external clock and an internal clock and generate a delayed enable signal;

a path selection unit configured to transmit the delayed enable signal;

a first delay information generation unit configured to generate a first delay information based on a latency information of the first signal and a delay amount of the first signal caused by the semiconductor device;

a second delay information generation unit configured to generate a second delay information based on a latency information of the second signal and a delay amount of the second signal caused by the semiconductor device;

a first shift unit configured to shift the delayed enable signal transmitted from the path selection unit in synchronism with the internal clock based on the first delay information; and a second shift unit configured to shift the delayed enable signal transmitted from the path selection unit in synchronism with the internal clock based on the second delay information.

17. The semiconductor device of claim 16, wherein the first signal is a read command and the second signal is a write command.

18. The semiconductor device of claim 17, wherein the path selection unit transmits the delayed enable signal to the second shift unit for a predetermined time and to the first shift unit after the predetermined time.

19. The semiconductor device of claim 16 further comprising an asynchronous control unit configured to control the first and second shift units to output their respective input signals without performing a shift operation.

* * * * *